(12) United States Patent
Wu

(10) Patent No.: US 11,898,744 B2
(45) Date of Patent: Feb. 13, 2024

(54) QUANTUM STRUCTURE THIN FILM AND QUANTUM STRUCTURE LIGHT-EMITTING MODULE INCLUDING THE SAME

(71) Applicant: SIC Technology CO. LTD, Hsinchu (TW)

(72) Inventor: Shien-Tsung Wu, Hsinchu (TW)

(73) Assignee: SIC TECHNOLOGY CO. LTD, Hsinchu (TW)

( * ) Notice: Subject to any disclaimer, the term of this patent is extended or adjusted under 35 U.S.C. 154(b) by 309 days.

(21) Appl. No.: 17/338,257

(22) Filed: Jun. 3, 2021

(65) Prior Publication Data

US 2021/0285624 A1 Sep. 16, 2021

Related U.S. Application Data

(63) Continuation-in-part of application No. 16/332,322, filed as application No. PCT/IB2017/054934 on Aug. 14, 2017, now abandoned.

(30) Foreign Application Priority Data

Sep. 13, 2016 (TW) .................................. 105129771
Nov. 15, 2016 (TW) .................................. 105137238

(51) Int. Cl.
*F21V 9/32* (2018.01)
*F21V 31/00* (2006.01)
(Continued)

(52) U.S. Cl.
CPC .............. *F21V 9/32* (2018.02); *F21V 31/005* (2013.01); *G02B 6/005* (2013.01); *G02B 6/0051* (2013.01); *G02B 6/0055* (2013.01); *G02F 1/133603* (2013.01); *G02F 1/133606* (2013.01); *G02F 1/133614* (2021.01); *G02F 1/133617* (2013.01); *F21Y 2113/10* (2016.08);
(Continued)

(58) Field of Classification Search
CPC ......... F21V 9/32; F21V 31/005; G02B 6/005; G02B 6/0051; G02B 6/0055; G02F 1/133603; G02F 1/133606; G02F 1/133614; G02F 1/133617; G02F 2202/36; F21Y 2113/10; F21Y 2115/10; H10K 59/38
See application file for complete search history.

(56) References Cited

U.S. PATENT DOCUMENTS 10,273,408 B2 * 4/2019 Satake .................... H01L 33/50
2010/0103648 A1   4/2010 Kim et al.
(Continued)

*Primary Examiner* — Bilkis Jahan
*Assistant Examiner* — Victor V Barzykin
(74) *Attorney, Agent, or Firm* — Hamre, Schumann, Mueller & Larson, P.C.

(57) ABSTRACT

A quantum structure thin film includes an excitation layer, a first substrate and a second substrate. The excitation layer includes a plurality of quantum structures which are one of quantum dots and quantum rods, and which are made of one of cesium lead halide and organic ammonium lead halide. The first substrate and the second substrate are respectively disposed on two opposite sides of the excitation layer. One of the first substrate and the second substrate includes an inner layer, a buffer layer, and an outer layer that are sequentially disposed on the excitation layer in such order. Also disclosed herein is a quantum structure light-emitting module including the quantum structure thin film.

18 Claims, 6 Drawing Sheets

(51) Int. Cl.
  *F21V 8/00* (2006.01)
  *G02F 1/13357* (2006.01)
  *G02F 1/1335* (2006.01)
  *F21Y 115/10* (2016.01)
  *F21Y 113/10* (2016.01)
  *H10K 59/38* (2023.01)

(52) U.S. Cl.
  CPC ....... *F21Y 2115/10* (2016.08); *G02F 2202/36* (2013.01); *H10K 59/38* (2023.02)

(56) References Cited

U.S. PATENT DOCUMENTS

| | | |
|---|---|---|
| 2014/0268655 A1 | 9/2014 | Murphy et al. |
| 2014/0362579 A1 | 12/2014 | Noh et al. |
| 2015/0301257 A1* | 10/2015 | Choi ........................ F21V 3/049 |
| | | 359/885 |
| 2016/0116121 A1 | 4/2016 | Hu et al. |
| 2017/0153382 A1* | 6/2017 | Wang .................... H01L 33/504 |
| 2017/0175973 A1 | 6/2017 | Dai et al. |
| 2017/0233645 A1 | 8/2017 | Zhong et al. |
| 2017/0321115 A1* | 11/2017 | Satake ...................... G02B 5/12 |
| 2017/0328539 A1* | 11/2017 | Huang ...................... F21V 9/30 |
| 2018/0072949 A1* | 3/2018 | Satake ...................... G02B 5/20 |
| 2018/0120492 A1* | 5/2018 | Lee ........................ C09K 11/703 |
| 2018/0208835 A1* | 7/2018 | Armstrong ................ B32B 7/12 |
| 2019/0113664 A1* | 4/2019 | Yoshikawa ............. H01L 33/58 |
| 2019/0204633 A1* | 7/2019 | He ........................ G02B 6/005 |
| 2019/0221721 A1* | 7/2019 | Tang ...................... H01L 33/502 |
| 2019/0293839 A1* | 9/2019 | Lee ...................... G02B 6/0055 |
| 2020/0251529 A1* | 8/2020 | Chu ...................... G02B 6/0051 |
| 2023/0039897 A1* | 2/2023 | Liao ...................... C09K 11/025 |
| 2023/0089713 A1* | 3/2023 | Liao ...................... C08F 220/36 |
| | | 362/606 |

* cited by examiner

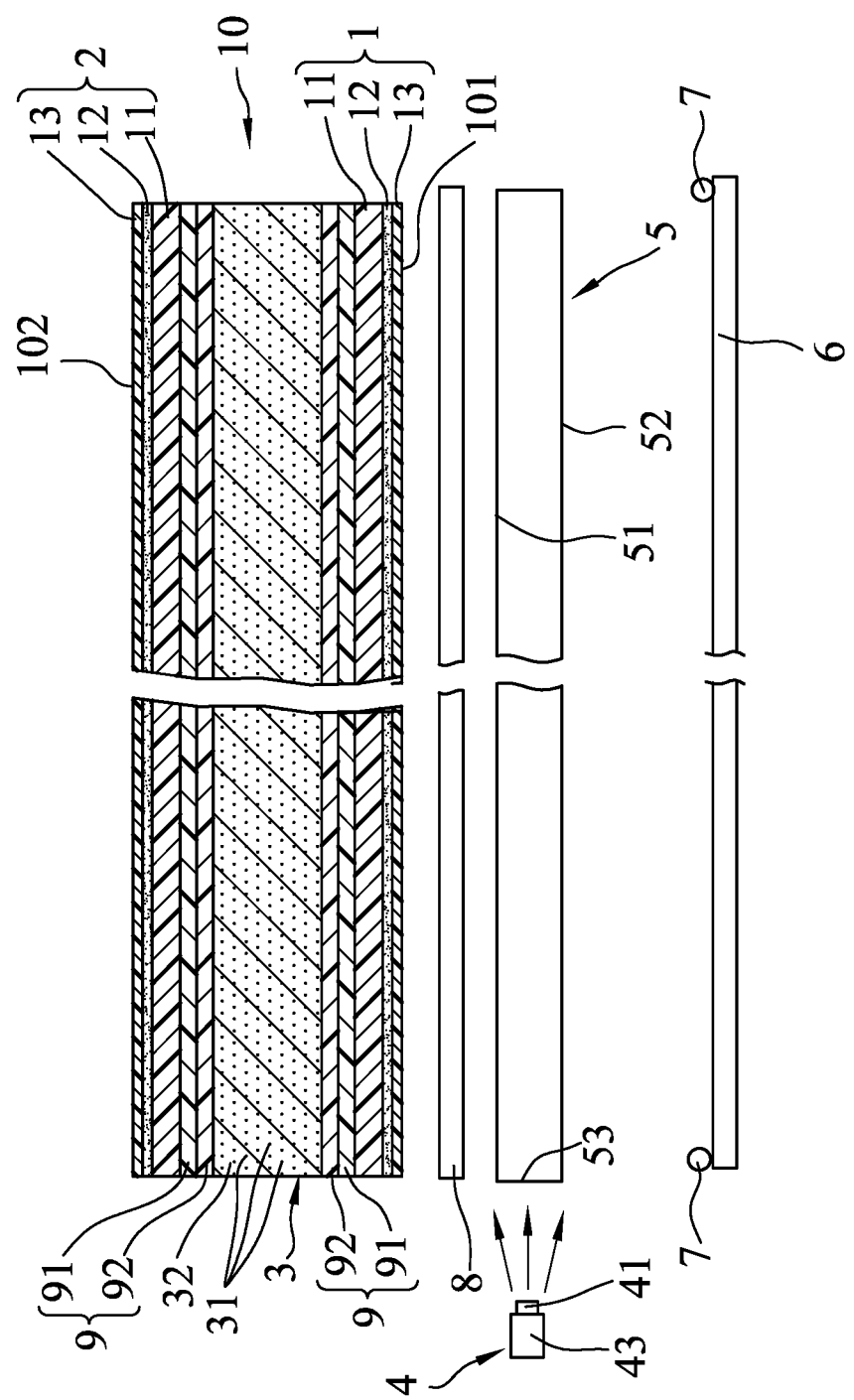

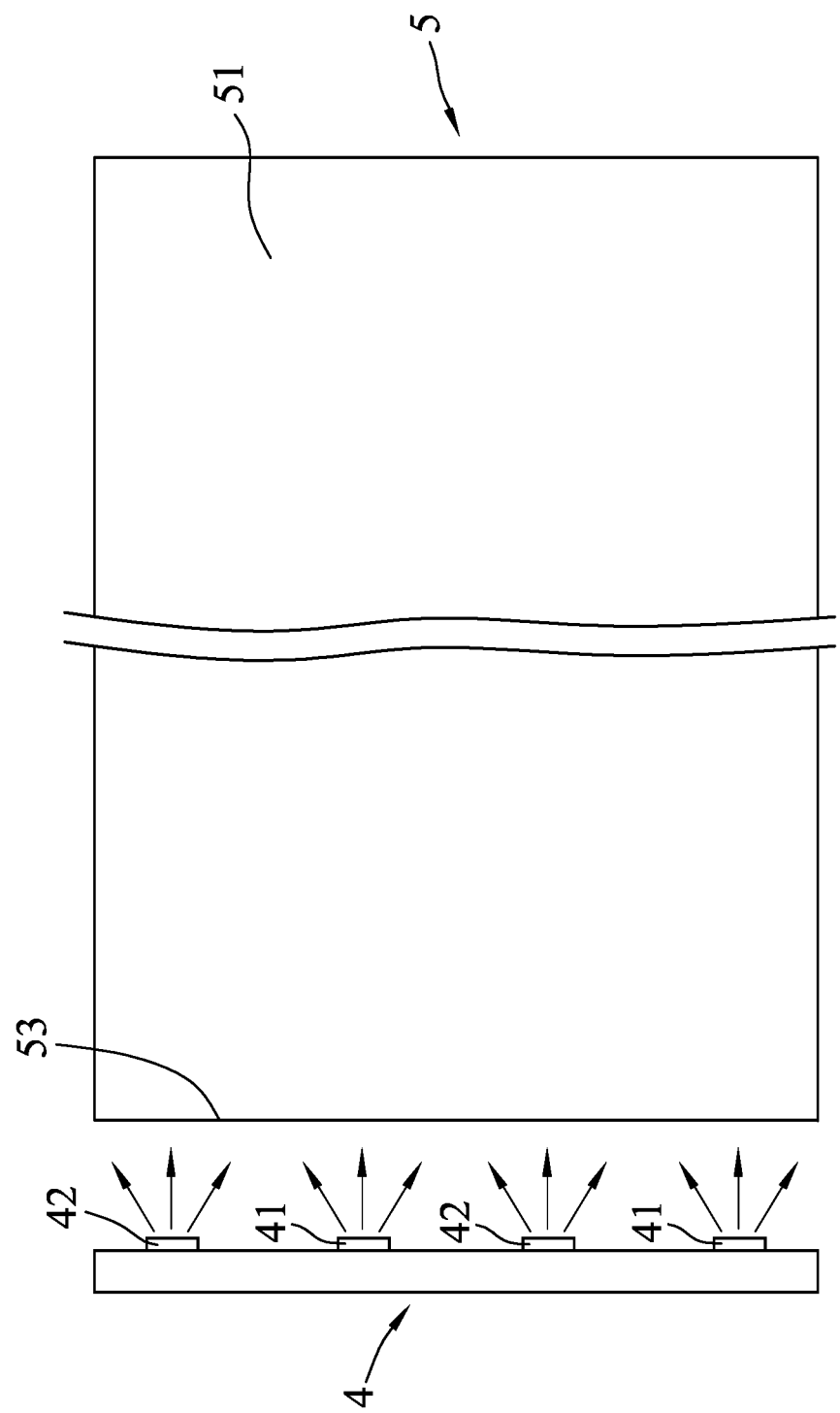

QUANTUM STRUCTURE THIN FILM AND QUANTUM STRUCTURE LIGHT-EMITTING MODULE INCLUDING THE SAME

CROSS-REFERENCE TO RELATED APPLICATION

This application is a continuation-in-part (CIP) application of U.S. patent application Ser. No. 16/332,322, which is a national stage application under 35 U.S.C. 371 of PCT International Application No. PCT/IB2017/054934, filed on Aug. 14, 2017, which claims priority of Taiwanese Invention Patent Application No. 105129771, filed on Sep. 13, 2016, and Taiwanese Invention Patent Application No. 105137238, filed on Nov. 15, 2016, the entire content of each of which is incorporated herein by reference.

FIELD

The disclosure relates to a quantum structure thin film including a plurality of quantum structures that are made of one of cesium lead halide and organic ammonium lead halide, and a quantum structure light-emitting module including the same.

BACKGROUND

A conventional quantum structure light-emitting module includes a light-emitting unit and a quantum structure thin film that includes a plurality of quantum dots. The light-emitting unit emits a first light to excite the quantum structure thin film so as to emit a second light, which mixes with the first light to form a desired output light. For example, a blue light-emitting unit emits a blue light to excite the quantum dots so as to emit a red light and a green light, which mix with the blue light to form a white light. The light response property of the quantum dots can be adjusted by changing the size or material of the quantum dots.

The quantum structure light-emitting module can be used in a backlight module of a display device. The display device including the quantum structure light-emitting module has superior color level, chromaticity, color gamut, and color saturation.

Conventionally, cadmium-containing semiconductor materials, such as cadmium sulfide, cadmium selenide, cadmium telluride, etc., are widely used for making the quantum dots. However, the toxic nature of the cadmium-containing semiconductor materials has driven scientists to seek for alternative materials, such as $CsPbX_3$, in which X can be fluorine, bromine, iodine, or combinations thereof. The light emitted by the quantum dots might be altered by changing the ratio of fluorine, bromine, and iodine, or by changing the size of the quantum dots. A blue-light-emitting unit is often used for exciting the $CsPbX_3$ quantum dots to obtain red and green lights. However, such excitation mechanism has a problem of insufficient amount of red light, resulting in inferior color gamut of the display device.

Moreover, the quantum structure thin film, when operated for a long time, is susceptible to overheating which might result in bowing thereof.

SUMMARY

Therefore, an object of the disclosure is to provide a quantum structure thin film and quantum structure light-emitting modules that can alleviate at least one of the drawbacks of the prior art.

In a first aspect, the quantum structure thin film includes an excitation layer, a first substrate and a second substrate. The excitation layer includes a plurality of quantum structures which are one of quantum dots and quantum rods, and which are made of one of cesium lead halide and organic ammonium lead halide. The first substrate and the second substrate are respectively disposed on two opposite sides of the excitation layer. One of the first substrate and the second substrate includes an inner layer, a buffer layer, and an outer layer that are sequentially disposed on the excitation layer in such order.

In a second aspect, the quantum structure light-emitting module includes the abovementioned quantum structure thin film, and a light-emitting unit that is spaced apart from the quantum structure thin film. The light-emitting unit includes a first light-emitting element emitting a blue light and a second light-emitting element emitting a red light. The blue light emitted from the first light-emitting element and the red light emitted from the second light-emitting element pass through the first substrate and enter the excitation layer. The blue light excites the quantum structures to emit a green light. The blue light, the red light and the green light are mixed and exit through the second substrate.

In a third aspect, the quantum structure light-emitting module includes a quantum structure thin film, a light-emitting unit, a light guide plate, a reflective sheet and a green phosphor. The quantum structure thin film has a multi-layered structure which includes an excitation layer, a first substrate and a second substrate. The excitation layer includes a plurality of quantum structures which are one of quantum dots and quantum rods, and which are made of one of cesium lead halide and organic ammonium lead halide. The first substrate and the second substrate are respectively disposed on two opposite sides of the excitation layer. The first substrate has an incident surface opposite to the excitation layer, and the second substrate has a light-exiting surface opposite to the excitation layer. The light-emitting unit is spaced apart from the quantum structure thin film, and includes a first light-emitting element emitting a blue light and a second light-emitting element emitting a red light. The blue light emitted from the first light-emitting element and the red light emitted from the second light-emitting element pass through the first substrate and enter the excitation layer. The blue light excites the quantum structures to emit a green light. The blue light, the red light and the green light are mixed and exit from the second substrate. The light guide plate is disposed on a side of the incident surface. The reflective sheet is disposed on a side of the light guide plate opposite to the quantum structure thin film. The green phosphor is disposed on the reflective sheet.

BRIEF DESCRIPTION OF THE DRAWINGS

Other features and advantages of the disclosure will become apparent in the following detailed description of the embodiment(s) with reference to the accompanying drawings, of which:

FIG. 5 is a fragmentary cross-sectional side view illustrating a fifth embodiment of the quantum structure light-emitting module according to the disclosure; and FIG. 6 is a fragmentary schematic view of the fifth embodiment, showing relative position of a light-emitting unit and a light guide plate of the fourth embodiment.

DETAILED DESCRIPTION

Figure 1:
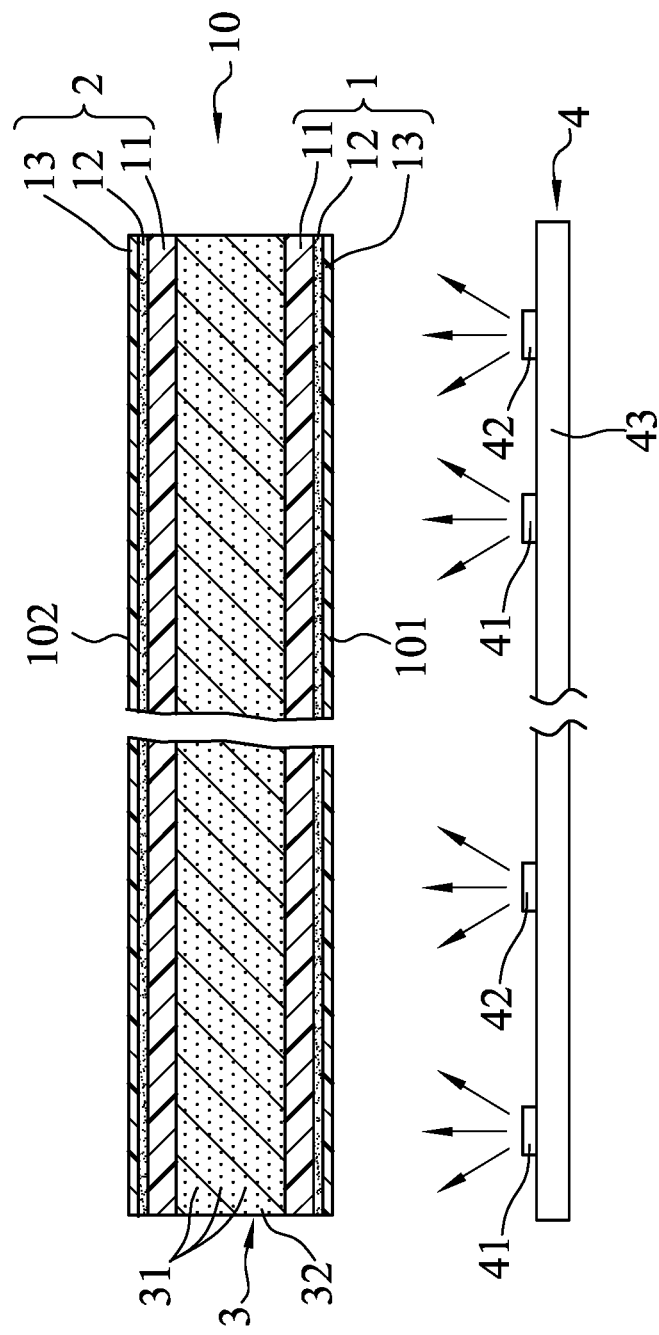
FIG. 1 is a fragmentary cross-sectional side view illustrating a first embodiment of a quantum structure light-emitting module according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of a quantum structure light-emitting module according to the present disclosure includes a quantum structure thin film 10 and a light-emitting unit 4. The quantum structure light-emitting module of this disclosure may be used in a display device (not shown in figures).

The quantum structure thin film 10 includes an excitation layer 3, a first substrate 1 and a second substrate 2.

The first substrate 1 and the second substrate 2 are respectively disposed on two opposite sides of the excitation layer 3. The first substrate 1 has an incident surface 101 opposite to the excitation layer 3, and the second substrate 2 has a light exiting surface 102 opposite to the excitation layer 3. At least one of the first substrate 1 and the second substrate 2 has a multi-layered structure which includes an inner layer 11, a buffer layer 12, and an outer layer 13 that are sequentially disposed on the excitation layer 3 in such order. In certain embodiments, one of the first substrate 1 and the second substrate 2 has the abovementioned multi-layered structure, and the other one of the first substrate 1 and the second substrate 2 has a single-layer structure which includes only the inner layer 11.

Alternatively, in this embodiment, each of the first substrate 1 and the second substrate 2 has the abovementioned multi-layered structure. The inner layers 11 and the outer layers 13 of the first and second substrate 1, 2 may be independently made of polyethylene terephthalate (PET), cyclic olefin copolymer (COC), polyimide (PI), polyethersulfone (PES), polyethylene naphthalate (PEN), polycarbonate (PC), and combinations thereof. The material for making the inner layer 11 of the first substrate 1 may be identical to or different from the material for making the inner layer 11 of the second substrate 2. Also, the material for making the outer layer 13 of the first substrate 1 may be identical to or different from the material for making the outer layer 13 of the second substrate 2. Each of the inner layers 11 may have a thickness ranging from 8 µm to 15 µm. Each of the outer layers 13 may have a thickness ranging from 30 µm to 45 µm.

For each of the first substrate 1 and the second substrate 2, the buffer layer 12 may be made of an optically clear adhesive. The buffer layer 12 may have a thickness ranging from 8 µm to 12 µm. The buffer layer 12 is configured to increase mechanical strength of the quantum structure thin film 10, so that the quantum structure thin film 10 is allowed to be use in a display device with a relatively larger area. It is noted that overheating of the quantum structure thin film 10 caused by operation for a long time would induce deformation of the inner layer(s) 11 and the outer layer(s) 13, which if present, may result in bowing of the quantum structure thin film 10. In such case, the buffer layer 12 may serve as a heat buffer layer to reduce such bowing of the quantum structure thin film 10.

The excitation layer 3 includes a main body 32 and a plurality of quantum structures 31 distributed in the main body 32. The quantum structures 31 are excitable by a blue light incident thereon to emit a green light. The quantum structures 31 may be one of quantum dots and quantum rods. When the quantum structures 31 are quantum dots, the quantum structures 31 may each have a dimension ranging from 3 nm to 13 nm (e.g., 9 nm to 13 nm), such that the green light emitted thereby is close to pure green, allowing the display device to have superior color gamut. The quantum structures 31 may be made of a perovskite material, which may include, but is not limited to, cesium lead halide and organic ammonium lead halide. In this embodiment, the cesium lead halide is $CsPbBr_3$, and the organic ammonium lead halide is $CH_3NH_3PbBr_3$. By using the abovementioned perovskite material, the quantum structures 31 are free of cadmium so as to be environmentally friendly.

When making the excitation layer 3, the perovskite materials are immersed into an oleic acid solution or an oleylamine solution that has a predetermined concentration for a predetermined period so as to obtain the quantum structures 31 with desired dimensions. The oleic acid solution and the oleylamine solution serve as stabilizers to improve light stability of the quantum structures 31. The resultant quantum structures 31 are then distributed in a colloidal system which may be made of a light-transmissible resin, and which may serve as a light homogenizer. The colloidal system with the quantum structures 31 may be then coated on the first substrate 1 and/or the second substrate 2, so as to form the main body 32 distributed with the quantum structures 31. Based on actual requirements, the excitation layer 3 may be subjected to an annealing process so as to change the bandgap and to reduce lattice defects of the quantum structures 31, thereby improving light efficiency of the excitation layer 3.

The light-emitting unit 4 is spaced apart from the quantum structure thin film 10. The light-emitting unit 4 includes a circuit board 43, and a plurality of first light-emitting elements 41 and a plurality of second light-emitting elements 42 that are alternatingly arranged on the circuit board 43. Each of the first light-emitting elements 41 may be a blue light-emitting diode that is capable of emitting a blue light. Each of the second light-emitting elements 42 may be a red light-emitting diode that is capable of emitting a red light. In certain embodiments, each of the second light-emitting elements 42 may include potassium fluorosilicate phosphor (KSF), which may be, but is not limited to, $K_2SiF_6:Mn^{4+}$ phosphor, which allows the second light-emitting element 42 to emit the red light with narrow full width at half maximum (FWHM) of its light emission spectrum, and with high energy, such that the color gamut of the display device is further improved.

In this embodiment, each of the first light-emitting elements 41 and each of the second light-emitting elements 42 are located within a projection of the quantum structure thin film 10 on the light-emitting unit 4. That is, the first embodiment is configured as a direct-lit quantum structure light-emitting module, where the first light-emitting elements 41 and the second light-emitting elements face the incident surface 102 of the first substrate 1.

In use, the blue light emitted from the first light-emitting elements 41 and the red light emitted from the second light-emitting elements 42 pass through the first substrate 1 from the incident surface 101 and enter the excitation layer 3. The blue light excites the quantum structures 31 to emit a green light. The green light emitted form the quantum structures 31 may have a dominant wavelength ranging from 520 nm to 540 nm. The green light emitted from the quantum structures 31, and the blue light and the red light emitted from the light-emitting unit 4 are mixed to form a white light and exit through the second substrate 2 from the light exiting surface 102.

Figure 2:
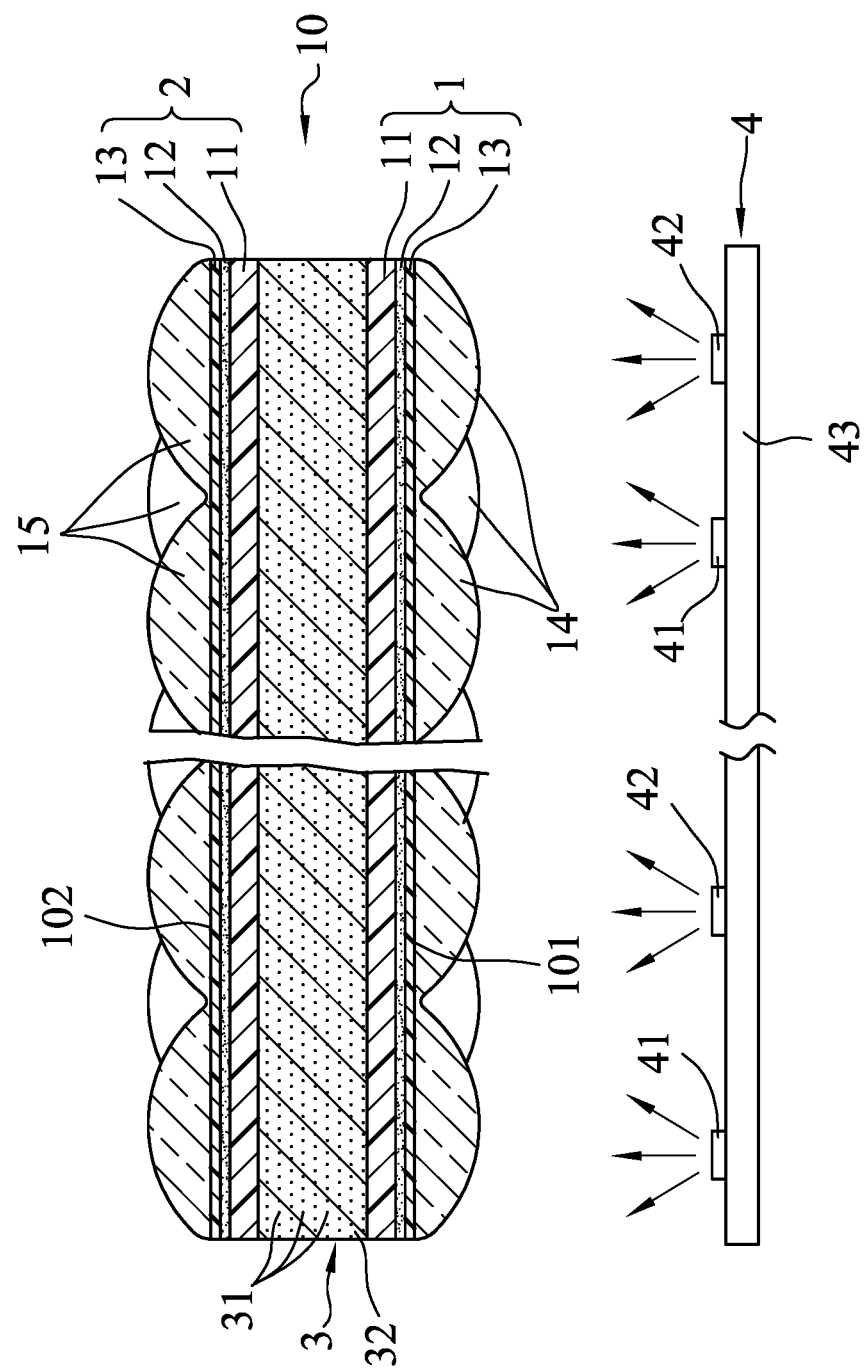
FIG. 2 is a fragmentary cross-sectional side view illustrating a second embodiment of the quantum structure light-emitting module according to the disclosure.

In certain embodiments, at least one of the first substrate 1 and the second substrate 2 may be formed with a plurality of microstructures opposite to the excitation layer 3. For example, referring to FIG. 2, a second embodiment of the quantum structure light-emitting module according to the present disclosure is generally similar to the first embodiment, except that in the second embodiment, the first substrate 1 is further formed with a plurality of first microstructures 14 opposite to the excitation layer 3, and the second substrate 2 is further formed with a plurality of second microstructures 15 opposite to the excitation layer 3. That is, the first and second microstructures 14, 15 are respectively formed on the outer layer 13 of the first substrate 1 and the outer layer 13 of the second substrate 2. The first microstructures 14 and the second microstructures 15 may improve light diffusion and light homogenization of the second embodiment. The first microstructures 14 and the second microstructures 15 may be independently made of poly(methyl methacrylate) (acrylic), polyurethane (PU), silicone, and combinations thereof. The shape of each of the first microstructures 14 and the second microstructures 15 may be identical to or different from each other, and may be conical, semicircular, hexagonal, or irregular, but is not limited thereto. The first microstructures 14 refract the light emitted from the light emitting unit 4, which increases the number of optical paths of the blue light in the excitation layer 3, so as to more effectively excite the quantum structures 31 to emit green light more effectively, thereby allowing the display device to achieve improved color gamut and color saturation. The second microstructures 15 reduce total internal reflection of exiting light, thereby improving light extraction efficiency of the second embodiment.

Figure 3:
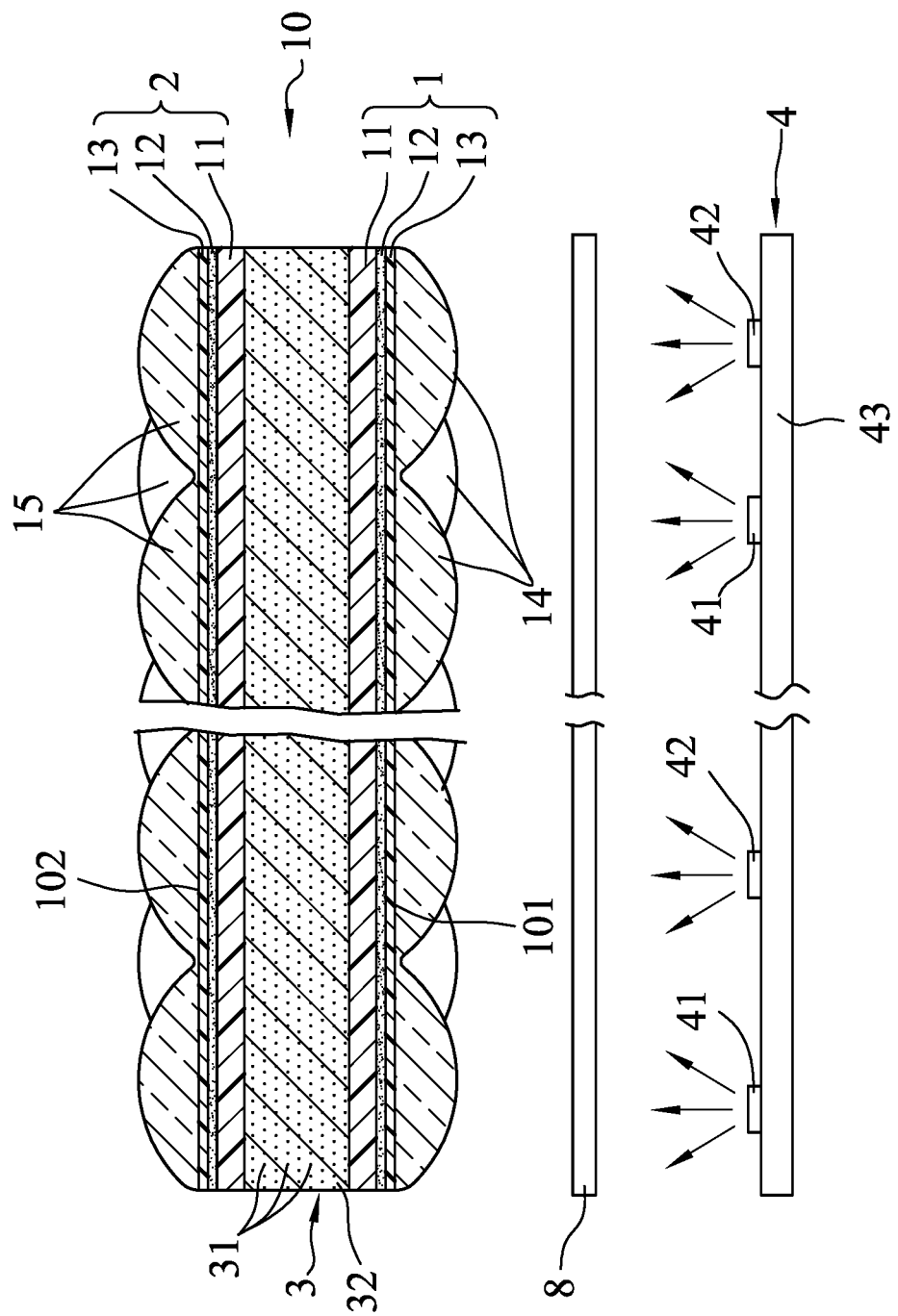
FIG. 3 is a fragmentary cross-sectional side view illustrating a third embodiment of the quantum structure light-emitting module according to the disclosure.

Referring to FIG. 3, a third embodiment of the quantum structure light-emitting module according to the present disclosure is generally similar to the second embodiment, except that the third embodiment further includes a diffusion sheet 8 disposed between the light-emitting unit 4 and the quantum structure thin film 10. The diffusion sheet 8 has a haze that is larger than 60%, so as to achieve an improved softness and uniformity of light, as well as improved light diffusion. Alternatively, the diffusion sheet may also be disposed on the quantum structure thin film 10 opposite to the light-emitting unit 4.

Figure 4:
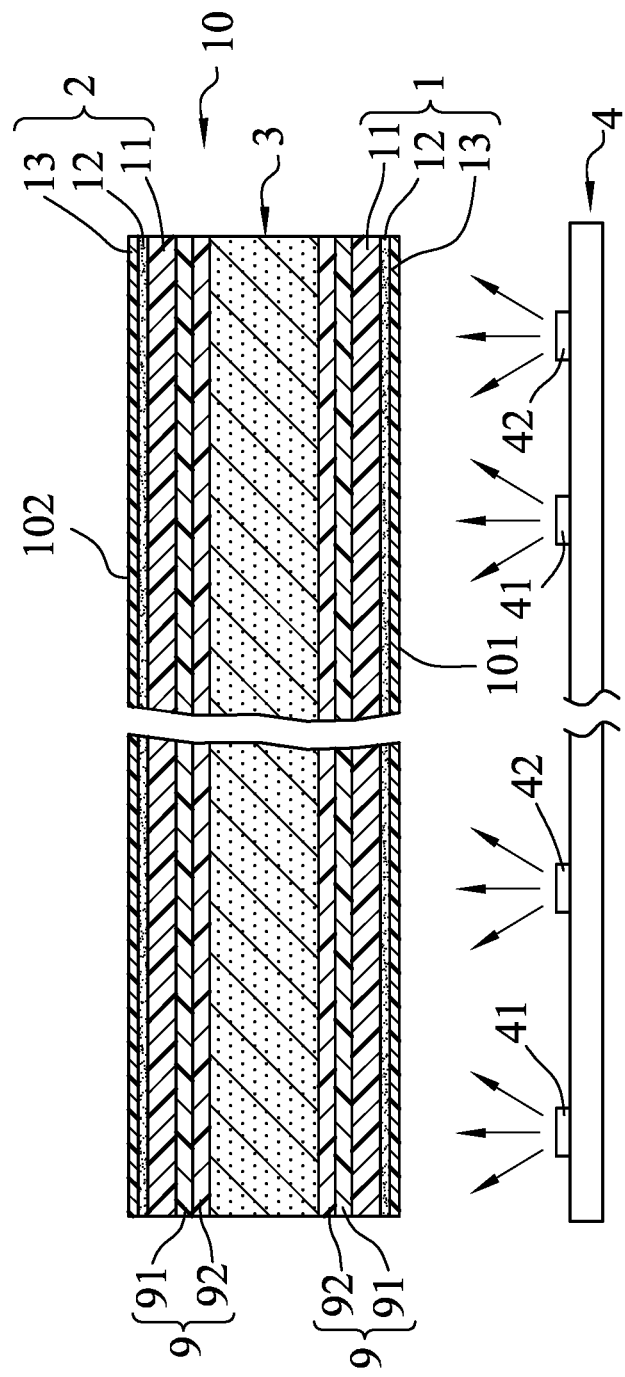
FIG. 4 is a fragmentary cross-sectional side view illustrating a fourth embodiment of the quantum structure light-emitting module according to the disclosure.

Referring to FIG. 4, a fourth embodiment of the quantum structure light-emitting module according to the present disclosure is generally similar to the first embodiment, except that the fourth embodiment further includes two water resistance units 9 that are respectively disposed between the excitation layer 3 and the first substrate 1 and disposed between the excitation layer 3 and the second substrate 2. Each of the water resistance units 9 includes a water resistance layer 91 and a combination layer 92.

The water resistance layers 91 of the water resistance units 9 are respectively formed on the inner layer 11 of the first substrate 1 and the inner layer 11 of the second substrate 2. The water resistance layer 91 of each of the water resistance units 9 is made of an organic material and an inorganic material, and is moisture impermeable. The organic material may be hexamethyldisiloxane. The inorganic material may be one of metal nitride, metal oxide and metal nitrogen oxide. The water resistance layer 91 of each of the water resistance units 9 has a thickness ranging from 5 nm to 200 nm, and can prevent the moisture from penetrating through the first substrate 1 and the second substrate 2 and affecting the excitation layer 3.

The combination layer 92 of each of the water resistance units 9 is disposed between the excitation layer 3 and the water resistance layer 91 of each of the resistance units 9, and is made of an organic material. In certain embodiment, the combination layer 92 of each of the water resistance units 9 is made of methyl methacrylate, epoxy methacrylate, epoxy acrylates, bisphenol A ethoxylate dimethacrylate, hexanediol diacrylate, bisphenol A epoxy acrylate, and combinations thereof. The combination layers 92 of the water resistance units function to increase adhesive between the water resistance lavers 91 of the water resistance units 9 and the excitation layer 3, and also may prevent moisture from penetrating through the first substrate and the second substrate 2. The combination layer 92 of each of the water resistance units 9 has a thickness of around 1 μm.

The combination layers 92 of the water resistance units 9 are formed by coating and thermal curing. The water resistance layers 91 of the water resistance units 9 are formed by sputtering technique. It is worth mentioning that the bonding formed between the organic and inorganic materials during sputtering may ensure the water resistance layers 91 to be less likely to crack, thereby providing superior water-resistant property.

Moisture may adversely affect the service life of the quantum structure light-emitting module. After long-term exposure to moisture, the efficiency of the excitation layer 3 may be decreased due to cracking. The water resistance layers 91 and the combination layers 92 of the water resistance units 9 not only attach well to the excitation layer 3, but provide water-resistant property to the excitation layer 3. In addition, the overall thickness of the water resistance units 9 are controlled so as not to add too much volume to the quantum structure light-emitting module.

It should be noted that, based on practical requirements, one of the water resistance units 9 may be omitted. The water resistance units 9 may also be adapted to the second embodiment, where the water resistance units 9 are respectively disposed between the first microstructures 14 and the excitation layer 3, and between the second microstructures 15 and the excitation layer 3.

In case of the first substrate 1 and/or the second substrate 2 having a multi-layered structure, only the inner layer 11 is placed in a reaction chamber which is subjected to evacuation, followed by formation of the water resistance unit 9 on the inner layer 11 in vacuum, and then the buffer layer 12 and the outer layer 13 may be disposed on and bonded to the inner layer 11 opposite to the water resistance unit 9 outside the reaction chamber. In such manner, the quantum structure light-emitting module can be manufactured in a cost and time efficient manner.

Referring to FIGS. 5 and 6, a fifth embodiment of the quantum structure light-emitting module according to the present disclosure is similar to the first embodiment, except that the fifth embodiment is configured as an edge-lit quantum structure light-emitting module, and further includes a light guide plate 5 that is disposed on a side of the incident surface 101 of the first substrate 1.

The light guide plate 5 has a light exiting light guide surface 51 facing the incident surface 101 of first substrate 1, a reflection light guide surface 52 opposite to the light exiting light guide surface 51, and an incident light guide surface 53 interconnecting the light exiting light guide surface 51 and the reflection light guide surface 52. The reflection light guide surface 52 may be formed with a dot array structure, and is capable of reflecting light. In this embodiment, the first light-emitting elements 41 and the second light-emitting elements 42 are alternatingly arranged along a side of the incident light guide surface 53 of the light guide plate 5 (see FIG. 5), and face the incident light guide surface 53.

The blue light emitted by each of the first light-emitting elements 41 and the red light emitted by each of the first light-emitting elements 42 enter the light guide plate 5 through the incident light guide surface 53, and are directed toward the light exiting light guide surface 51 by the reflection light guide surface 52. After exiting the light exiting light guide surface 51, the blue and red lights enter the quantum structure thin film 10 through the incident surface 101.

The quantum structure light-emitting module may further include a reflective sheet 6 and a green phosphor 7. The reflective sheet 6 is disposed on the reflection light guide surface 52 of the light guide plate 5 to reflect the lights leaking through the reflection light guide surface 52 back to the light guide plate 5, so as to reduce light loss and improve the brightness of the quantum structure light-emitting module. The green phosphor 7 may be disposed on the reflective sheet 6. The red and/or blue lights leaking through the reflection light can excite the green phosphor 7 to emit a green light, which is then directed toward the light guide plate 5 by the reflective sheet 6. As such, a total amount of green light exiting the quantum structure thin film 10 (i.e., the green light emitted by the green phosphor 7 and the quantum structures 31) can be increased, and the problem of an undesired color (such as magenta color) present in the corners and edges of a conventional edge-lit display panel can be thus effectively reduced.

The quantum structure light-emitting module may further include a diffusion sheet 8 disposed between light guide plate 5 and the quantum structure thin film 10. The diffusion sheet 8 may have a haze that is larger than 60%.

The quantum structure light-emitting module may further include at least one water resistance unit 9 as described in the fourth embodiment that is disposed between the excitation layer 3 and one of the first substrate 1 and the second substrate 2.

To sum up, the quantum structure light-emitting module of this disclosure utilizes the blue light emitted by the first light-emitting elements 41 to excite the quantum structures 31 so as to emit the green light. The green light is mixed with the blue light emitted from the first light-emitting elements 41 and the red light emitted from the second light-emitting elements 42 to form the white light, which differs from a conventional light-emitting module that generates red light by using blue light excitation. The quantum structure light-emitting module of this disclosure has a relatively stronger red light intensity, thereby allowing the display device including the quantum structure light-emitting module to have superior color gamut, color saturation and intensity of the white light. When the second light-emitting elements 42 include $K_2SiF_6:Mn^{4+}$ phosphor, the color gamut and the color saturation of the display device are further improved. Moreover, by including the buffer layer 12 in each of the first substrate 1 and/or the second substrate 2, quantum structure thin film 10 may have an improved strength, and a reduced deformation due to overheating.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A quantum structure light-emitting module, comprising:
    a quantum structure thin film which includes:
        an excitation layer including a plurality of quantum structures, said quantum structures being one of quantum dots and quantum rods, and being made of one of cesium lead halide and organic ammonium lead halide, and
        a first substrate and a second substrate that are respectively disposed on two opposite sides of said excitation layer, wherein one of said first substrate and said second substrate includes an inner layer, a buffer layer, and an outer layer that are sequentially disposed on said excitation layer in such order;
    a light-emitting unit that is spaced apart from said quantum structure thin film, and that includes a first light-emitting element emitting a blue light and a second light-emitting element emitting a red light, wherein the blue light emitted from said first light-emitting element and the red light emitted from said second light-emitting element pass through said first substrate and enter said excitation layer, the blue light exciting said quantum structures to emit a green light, and the blue light, the red light and the green light being mixed and exiting through said second substrate, and said first substrate has an incident surface opposite to said excitation layer and said second substrate has a light-exiting surface opposite to said excitation layer;
    a light guide plate disposed on a side of said incident surface of said first substrate, said light guide plate having a light exiting light guide surface facing said incident surface of said first substrate, a reflection light guide surface opposite to said light exiting light guide surface, and an incident light guide surface interconnecting said light exiting light guide surface and said reflection light guide surface, said first light-emitting element and said second light-emitting element facing said incident light guide surface; and a reflective sheet that is disposed on said reflection light guide surface of said light guide plate, and a green phosphor disposed on said reflective sheet.

2. The quantum structure light-emitting module of claim 1, wherein said quantum structure thin film further includes at least one water resistance unit that is disposed between said excitation layer and one of said first substrate and said second substrate, said at least one water resistance unit including a water resistance layer that is made of an organic material and an inorganic material and that is moisture impermeable.

3. The quantum structure light-emitting module of claim 1, wherein the other one of said first substrate and said second substrate includes an inner layer, a buffer layer, and an outer layer that are sequentially disposed on said excitation layer in such order.

4. The quantum structure light-emitting module of claim 1, wherein said second light-emitting element is a red light-emitting diode including potassium fluorosilicate phosphor.

5. The quantum structure light-emitting module of claim 4, wherein said quantum structures are quantum dots, each with a dimension ranging from 9 nm to 13 nm.

6. The quantum structure light-emitting module of claim 5, wherein the green light emitted from said quantum structures has a dominant wavelength ranging from 520 nm to 540 nm.

7. The quantum structure light-emitting module of claim 1, wherein said first substrate is formed with a plurality of first microstructures opposite to said excitation layer.

8. The quantum structure light-emitting module of claim 1, wherein said second substrate is formed with a plurality of second microstructures opposite to said excitation layer.

9. The quantum structure light-emitting module of claim 1, further comprising a diffusion sheet disposed between said light guide plate and said quantum structure thin film, said diffusion sheet having a haze that is larger than 60%.

10. A quantum structure light-emitting module, comprising:
a quantum structure thin film, said quantum structure thin film having a multi-layered structure which includes:
an excitation layer including a plurality of quantum structures, said quantum structures being one of quantum dots and quantum rods, and being made of one of cesium lead halide and organic ammonium lead halide, and
a first substrate and a second substrate that are respectively disposed on two opposite sides of said excitation layer, said first substrate having an incident surface opposite to said excitation layer, and said second substrate having a light exiting surface opposite to said excitation layer;
a light-emitting unit that is spaced apart from said quantum structure thin film, and that includes a first light-emitting element emitting a blue light and a second light-emitting element emitting a red light, wherein the blue light emitted from said first light-emitting element and the red light emitted from said second light-emitting element pass through said first substrate and enter said excitation layer, the blue light exciting said quantum structures to emit a green light, and the blue light, the red light and the green light being mixed and exiting from said second substrate;
a light guide plate disposed on a side of said incident surface;
a reflective sheet disposed on a side of said light guide plate opposite to said quantum structure thin film; and
a green phosphor disposed on said reflective sheet.

11. The quantum structure light-emitting module of claim 10, further comprising a diffusion sheet disposed between said light-emitting unit and said quantum structure thin film, said diffusion sheet having a haze value larger than 60%, and wherein said quantum structure thin film further includes at least one water resistance unit that is disposed between said excitation layer and one of said first substrate and said second substrate, said at least one water resistance unit including a water resistance layer that is made of an organic material and an inorganic material and that is moisture impermeable.

12. The quantum structure light-emitting module of claim 10, wherein one of said first substrate and said second substrate includes an inner layer, a buffer layer, and an outer layer that are sequentially disposed on said excitation layer in such order.

13. The quantum structure light-emitting module of claim 12, wherein the other one of said first substrate and said second substrate includes an inner layer, a buffer layer, and an outer layer that are sequentially disposed on said excitation layer in such order.

14. The quantum structure light-emitting module of claim 10, wherein said first substrate is formed with a plurality of first microstructures opposite to said excitation layer.

15. The quantum structure light-emitting module of claim 14, wherein said second substrate is formed with a plurality of second microstructures opposite to said excitation layer.

16. The quantum structure light-emitting module of claim 10, wherein said second light-emitting element emitting the red light includes potassium fluorosilicate phosphor.

17. The quantum structure light-emitting module of claim 10, wherein said quantum structures are quantum dots, each with a dimension ranging from 9 nm to 13 nm.

18. The quantum structure light-emitting module of claim 10, wherein the green light emitted from said quantum structures has a dominant wavelength ranging from 520 nm to 540 nm.

* * * * *